(12) United States Patent
Hu et al.

(10) Patent No.: US 7,304,372 B2
(45) Date of Patent: Dec. 4, 2007

(54) SEMICONDUCTOR PACKAGE

(75) Inventors: Kunzhong Hu, Santa Monica, CA (US); Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/524,692

(22) Filed: Sep. 21, 2006

(65) Prior Publication Data

US 2007/0063216 A1 Mar. 22, 2007

Related U.S. Application Data

(60) Provisional application No. 60/719,242, filed on Sep. 21, 2005.

(51) Int. Cl.
*H01L 23/02* (2006.01)
*H01L 23/10* (2006.01)

(52) U.S. Cl. ............... 257/678; 257/706; 257/707; 257/712; 257/713; 257/717; 257/720; 257/723; 257/725; 257/773; 257/796; 257/E23.079; 257/E23.101; 257/E23.103; 257/E23.105; 257/E33.075

(58) Field of Classification Search ........ 257/678–733, 257/787–796, E23.001–E23.194, E21.499–E21.519, 257/276, 625, 675, 706, 707, 712–722, E33.075, 257/E31.131, E23.051; 438/122
See application file for complete search history.

(56) References Cited

U.S. PATENT DOCUMENTS

| | | | |
|---|---|---|---|
| 5,532,512 A * | 7/1996 | Fillion et al. | 257/686 |
| 6,858,922 B2 * | 2/2005 | Pavier | 257/676 |
| 7,030,501 B2 * | 4/2006 | Yoshiba et al. | 257/777 |

* cited by examiner

*Primary Examiner*—Jasmine Clark
(74) *Attorney, Agent, or Firm*—Ostrolenk, Faber, Gerb & Soffen, LLP

(57) ABSTRACT

A semiconductor package including a bidirectional compound semiconductor component and two power semiconductor devices connected in a cascode configuration.

11 Claims, 6 Drawing Sheets

SEMICONDUCTOR PACKAGE

RELATED APPLICATION

This application is based on and claims benefit of U.S. Provisional Application Ser. No. 60/719,242, filed on Sep. 21, 2005, entitled Bidirectional Enhancement Mode CSC FET Packaging, to which a claim of priority is hereby made and the disclosure of which is incorporated by reference.

BACKGROUND AND SUMMARY OF THE INVENTION

The present invention relates to semiconductor packages and more particularly to power semiconductor packages.

Wirebonds are used in a typical semiconductor package to interconnect the electrodes of the semiconductor device contained within the package to electrodes of other devices contained therein and/or to leads or conductive pads. A major drawback of using wirebonds is increased on resistance. It is desirable to reduce the overall resistance of the package.

Furthermore, it is desirable to withdraw as much heat as possible from the semiconductor devices contained within a package in order to improve the performance thereof.

In addition, it is desirable to reduce the footprint of a package.

A semiconductor package according to an embodiment of the present invention includes a substrate having a plurality of conductive pads disposed on at least one major surface thereof, a bidirectional compound semiconductor component having at least a first power electrode electrically and mechanically connected to a respective conductive pad and a second power electrode electrically and mechanically connected to a respective conductive pad; a first power semiconductor device having a first power electrode electrically connected to the first power electrode of the compound semiconductor component, and a second power electrode electrically and mechanically connected to at least one conductive pad; second power semiconductor having a first power electrode electrically connected to the second power electrode of the compound semiconductor component, and a second power electrode electrically and mechanically connected to at least one conductive pad; wherein the bidirectional compound semiconductor component, the first power semiconductor device, and the second power semiconductor device are electrically connected within the package in cascode arrangement.

In the preferred embodiment, the first and the second power semiconductor devices are power MOSFETs and the bidirectional compound power semiconductor device is a III-nitride based bidirectional power semiconductor device.

A package according to the present invention, may further include a first heatsink electrically connecting the first power electrode of the first power semiconductor device to the first power electrode of the compound semiconductor component, and a second heatsink electrically connecting the first power electrode of the second power semiconductor device to the second power electrode of the compound semiconductor component. The first heatsink and the second heatsink are preferably thermally coupled to the compound semiconductor component.

A package according to the present invention may further include a molded housing disposed around the first and second semiconductor devices and the compound semiconductor component.

In one embodiment of the present invention the heatsinks are exposed through the molded housing.

In another embodiment of the present invention, the heatsinks are encapsulated in the molded housing.

Other features and advantages of the present invention will become apparent from the following description of the invention which refers to the accompanying drawings.

DEFINITIONS

A compound semiconductor component (CSC) as used herein refers to a heterojunction type semiconductor device including III-nitride based power semiconductor devices, for example, high electron mobility transistors (HEMTs), metal insulator semiconductor HEMTs (MISHEMTs), metal oxide semiconductor (MOSHEMTs), and the like devices.

Unless otherwise indicated, a power semiconductor device as used herein refers to a single material semiconductor device such as a silicon-based power semiconductor device (e.g. silicon-based or SiC based MOSFET).

DETAILED DESCRIPTION OF THE FIGURES

Figure 1A:
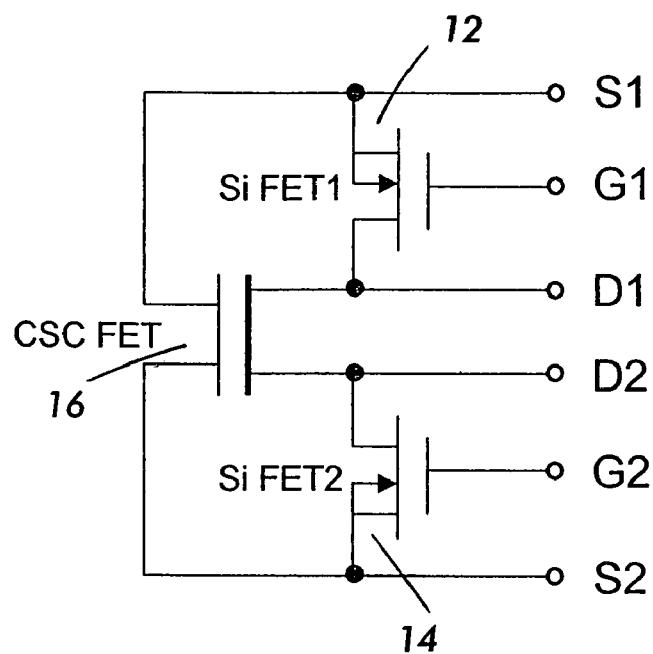
FIG. 1A illustrates a circuit diagram of the bidirectional CSC and the power semiconductor devices arranged in a package according to the present invention.
Figure 1B:
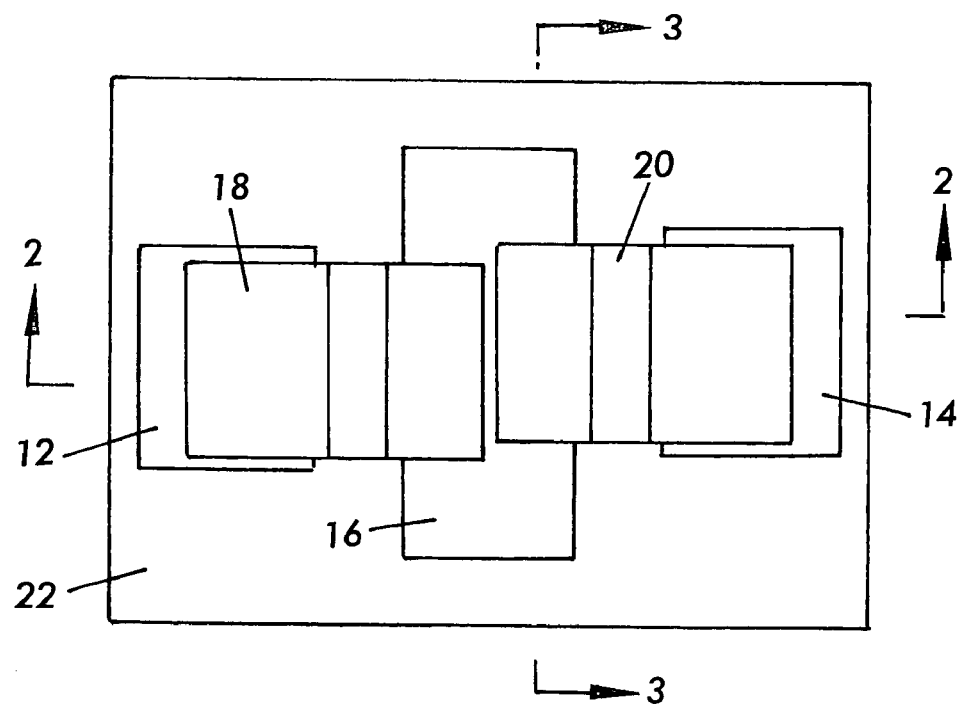
FIG. 1B shows a top plan view of a semiconductor package according to the first embodiment of the present invention.
Figure 2:
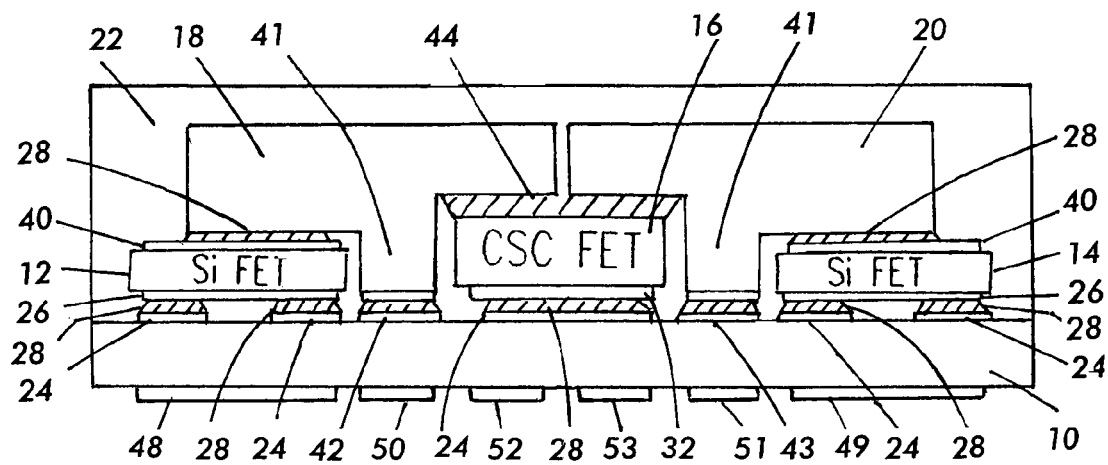
FIG. 2 shows a cross-sectional view along line 2-2 of FIG. 1B, viewed in the direction of the arrows.
Figure 3:
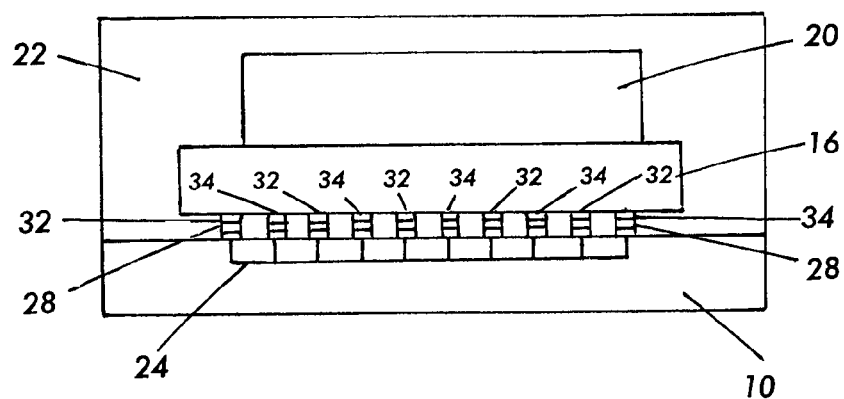
FIG. 3 shows a cross-sectional view along line 3-3 of FIG. 1B, viewed in the direction of the arrows.

Referring to FIGS. 1A, 1B, 2 and 3, a semiconductor package according to the first embodiment of the present invention includes substrate 10, first power semiconductor device 12 (e.g. a silicon-based power MOSFET), second power semiconductor device 14 (e.g. a silicon based power MOSFET), a bidirectional CSC 16 (e.g. a III-nitride based bidirectional HEMT), first heatsink connector 18, second heatsink connector 20 and molded housing 22 (rendered transparent in FIG. 1B for better illustration).

Substrate 10 includes a plurality of conductive pads 24 on one surface thereof. First power electrode 26 (e.g. source electrode) of first power semiconductor device 12 is electrically and mechanically connected to at least one respective conductive pad 24 with a layer of conductive adhesive 28 such as solder, conductive epoxy (e.g. silver epoxy) or the like material. First power electrode 26 (e.g. source electrode) of second power semiconductive device 14 is electrically and mechanically coupled to at least one respective conductive pad 24. Note that although not shown specifically control electrode 30 (see FIGS. 4, 5) (e.g. gate electrode) of each power semiconductor device 12, 14 is also electrically and mechanically connected to a respective conductive pad 24.

Figure 6:
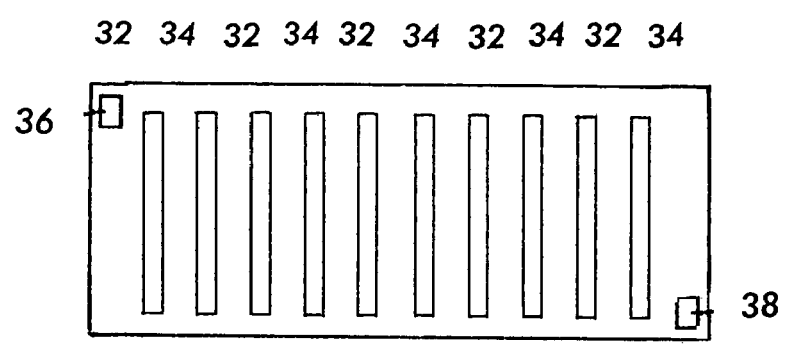
FIG. 6 shows a top plan view of a bidirectional CSC used in a package according to the present invention.

Bidirectional CSC 16 includes a plurality of power electrodes 32, 34, and the gate electrodes 36, 38 (see FIG. 6). An example of a bidirectional CSC is disclosed in U.S. patent application Ser. No. 11/056,062, assigned to the assignee of the present application. Each power electrode 32, 34 can serve as a source or drain depending on the direction of the current. Preferably, bidirectional CSC 16 will have copper bumps, solder bumps or the like on the electrodes thereof to eliminate wirebonding. Note that power electrodes 32, 34 according to one preferred arrangement may be alternately arranged. Each power electrode 32, 34 is electrically and mechanically coupled to a respective conductive pad 24 with a layer of conductive adhesive 28. Similarly, each gate electrode 36, 38 (although not shown) is electrically and mechanically coupled to a respective conductive pad 24.

First heatsink connector 18 is electrically and mechanically coupled to second power electrode 40 of first power semiconductor device 12 with a layer of conductive adhesive 28 (e.g. solder or conductive epoxy), and includes a projection 41 which is electrically and mechanically connected with a layer of conductive adhesive 28 to conductive pad 42. Thus, first heatsink connector 18, electrically connects second power electrode 40 of first power semiconductor device 12 to one of the power electrodes (e.g. power electrodes 32) of bidirectional CSC 16. For example, conductive pad 42 is electrically connected to a respective conductive pad 24 to which a power electrode (e.g. a power electrode 32) is electrically connected either through substrate 10 or over a surface thereof through copper traces or the like. First heatsink connector 18 is preferably also thermally coupled to the back of bidirectional CSC 16 through a thermally conductive body 44.

Second heatsink connector 20 also includes projection 41, which is electrically and mechanically coupled to conductive pad 43, whereby second power electrode 40 of second power semiconductor device 14 (which is electrically and mechanically coupled to second heatsink 20 by a conductive adhesive layer 28) is electrically connected though conductive pad 43 to the other power electrodes 34 of bidirectional CSC 16 in a manner similar or identical to conductive pad 43. Note also that second heatsink connector 20 is also thermally coupled through layer 44 to the back of bidirectional CSC 16.

Substrate 10 further includes a plurality of terminals 48, 49, 50, 51, 52, 53 for external connection. Each of the terminals is connected to at least one respective conductive pad 24, 42, 43 with a connector or a via (not shown) that extends through the body of substrate 10, whereby the devices inside the package can be connected electrically to another circuit at the bottom of substrate 10 thereby reduces the footprint of the package. Thus, power terminal 48 is connected to a conductive pad 24 that is connected to first power electrode 26 of first power semiconductor device 12, power terminal 50 is electrically connected to pad 42 and thus connected to the second power electrode of first power semiconductor device 12 (and a power electrode, e.g. electrode 32 of bidirectional CSC 16), and control terminal 52 is electrically connected to a conductive pad which is electrically and mechanically connected to control electrode 30 of first power semiconductor device 12. Similarly, power terminal 49 is connected to a conductive pad 24 that is connected to first power electrode 26 of second power semiconductor device 14, power terminal 51 is electrically connected to pad 43 and thus connected to the second power electrode of second power semiconductor device 14 (and a power electrode, e.g. electrode 34 of bidirectional CSC 16), and control terminal 53 is electrically connected to a conductive pad which is electrically and mechanically connected to control electrode 30 of second power semiconductor device 14.

In the first embodiment of the present invention, molded housing 22 encapsulates bidirectional CSC 16, first and second power devices 12, 14 and first and second heatsink connectors 18, 20.

Note that, advantageously, the semiconductor devices 12, 14, 16 are interconnected without the use of wirebonds. Note also that heat is extracted from semiconductor devices 12, 14, 16 from both sides of the devices, thereby achieving dual-sided cooling.

Figure 4:
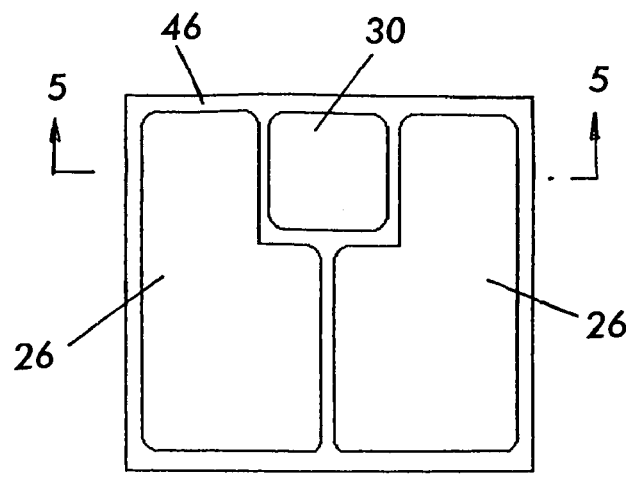
FIG. 4 illustrates a top plan view of an example of a power semiconductor device as used in a package according to the present invention.
Figure 5:
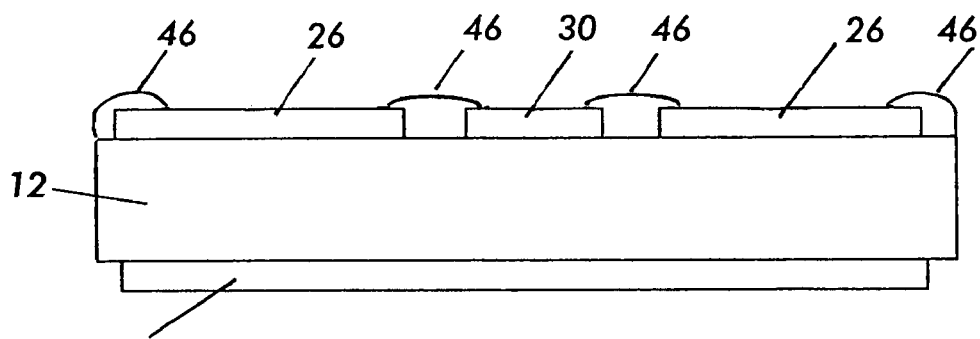
FIG. 5 shows a cross-sectional view along line 5-5 in FIG. 4, viewed in the direction of the arrows.

Referring to FIGS. 4, 5, note that control electrode 30 (e.g. gate electrode), first power electrode 26 (e.g. source electrode), and second power electrode 40 (e.g. drain electrode) of each power semiconductor device 12, 14 is preferably rendered solderable to allow for wirebond-free connection. A passivation body 46 which preferably functions as a solder-resist is disposed between first power electrode 26 and control electrode 30 to provide protection for the device and prevent shorting during assembly due to the encroachment of solder or the like during reflow.

Figure 7:
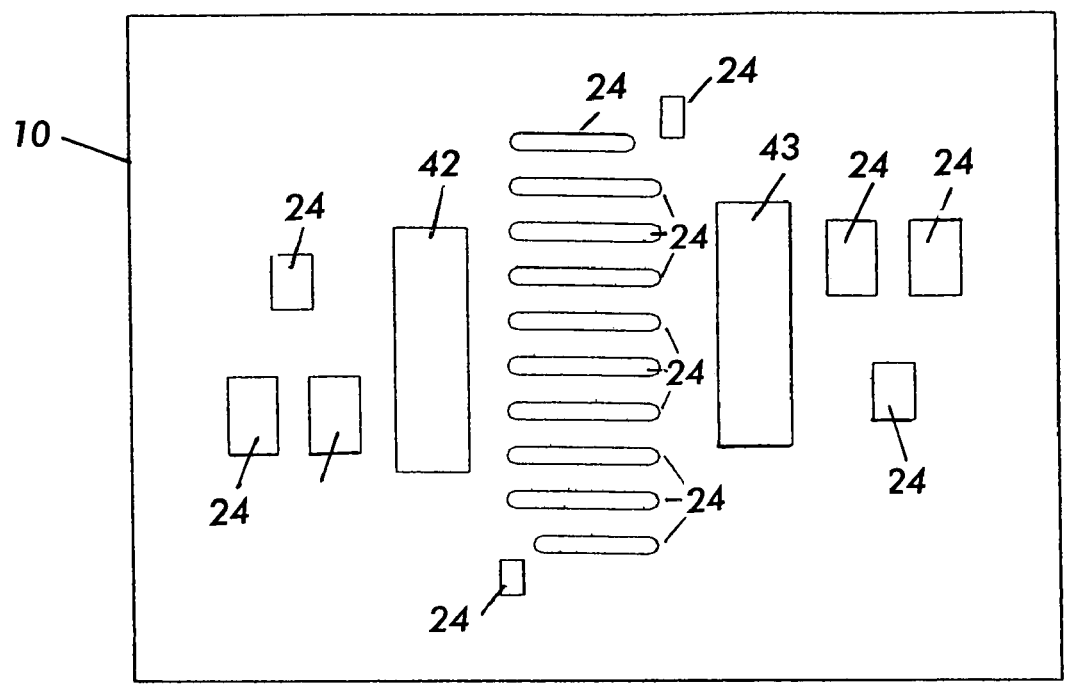
FIG. 7 shows a top plan view of a substrate used in a package according to the present invention.
Figure 8:
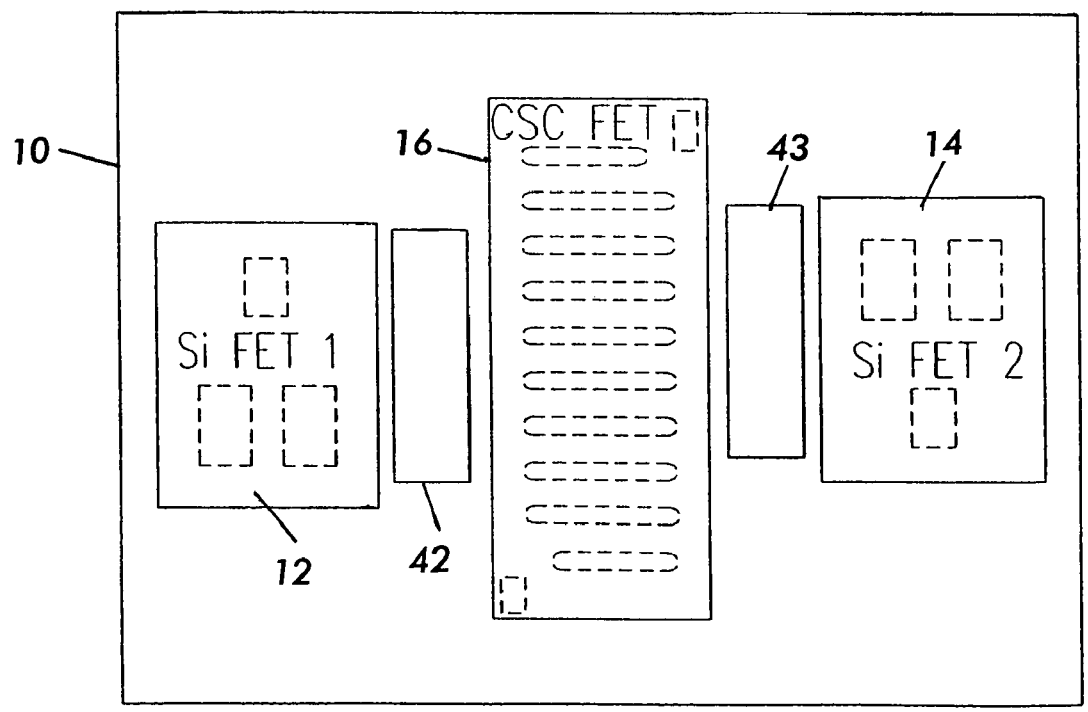
FIG. 8 shows a top plan view of the substrate in FIG. 7 after assembly thereon of power semiconductor devices and bidirectional CSC.
Figure 9:
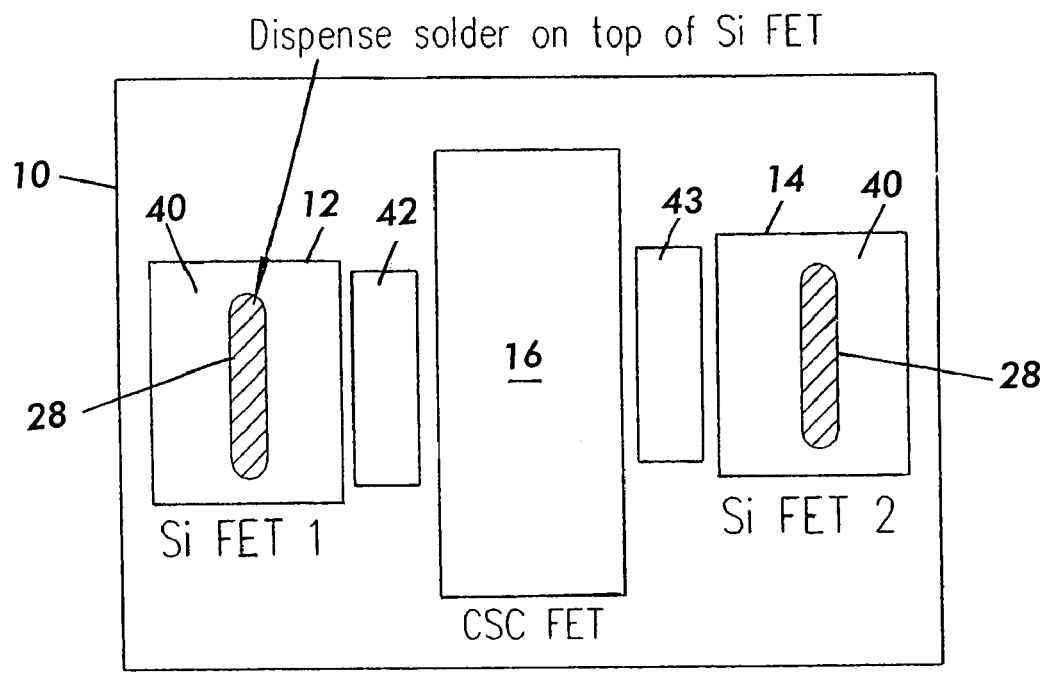
FIG. 9 shows the assembly shown in FIG. 8 after dispensing of solder.
Figure 10:
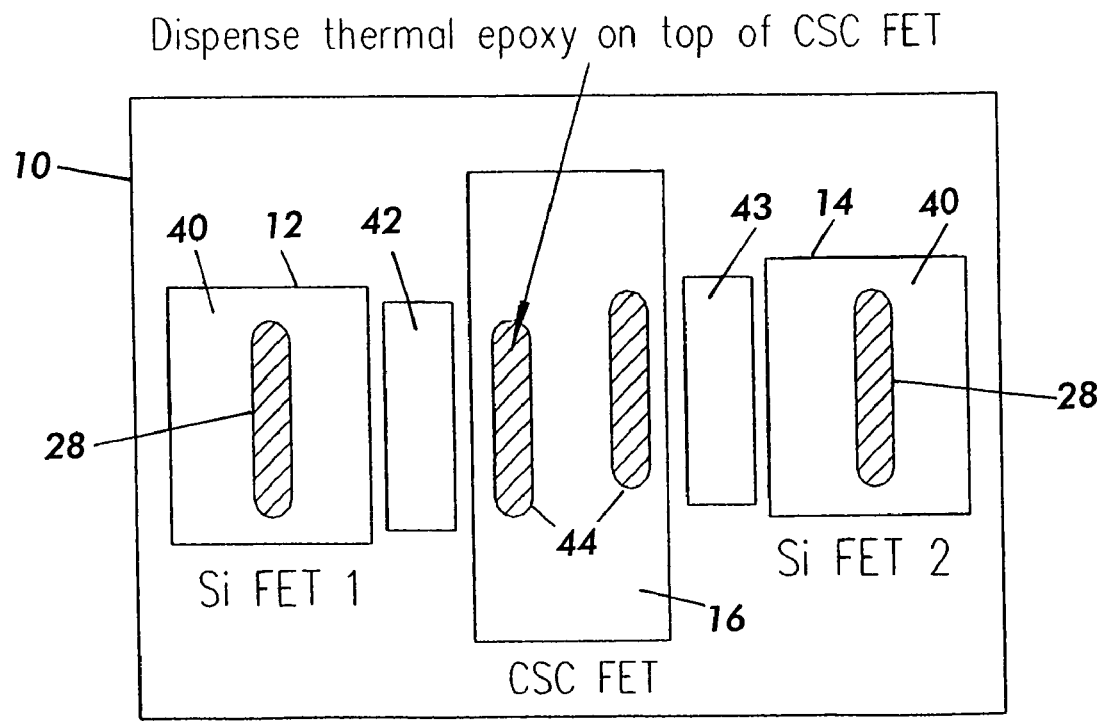
FIG. 10 shows the assembly shown in FIG. 9 after dispensing of a thermally conductive body on the back of bidirectional CSC.

Referring to FIGS. 7-10, a semiconductor package according to the present invention is fabricated by first electrically and mechanically attaching first and second power semiconductor devices 12, 14 and bidirectional CSC 16 to conductive pads 24 of substrate 12 as illustrated by FIGS. 7 and 8. Thereafter, a conductive adhesive 28 (e.g. solder) is dispersed onto second power electrodes 40 of first and second power semiconductor devices 12, 14 as illustrated by FIG. 9. Next, thermal bodies 44 are applied to the back of bidirectional CSC 16 as illustrated by FIG. 10. Finally, first and second heatsinks 18, 20 are mounted as described and molded housing 22 is provided to the assembly.

Figure 11:
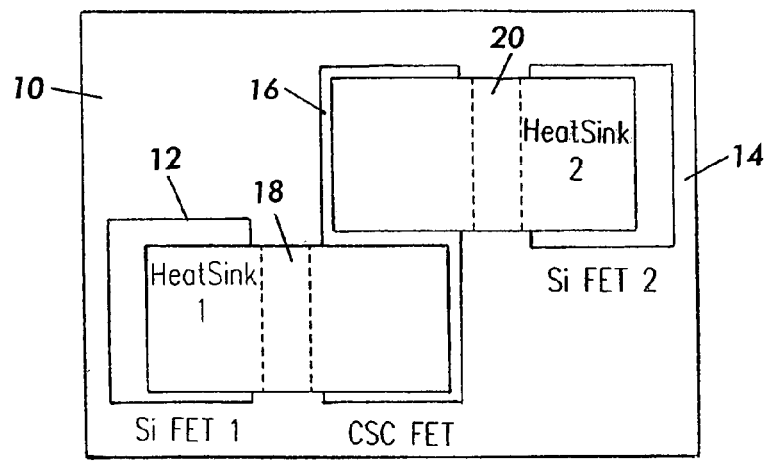
FIG. 11 shows a top plan view of a second embodiment of the present invention.

Referring to FIG. 11, according to a second embodiment, heatsink connectors 18, 20 can be arranged side-by-side, instead of opposite one another to cover substantially the entire back of bidirectional CSC 16.

Figure 12:
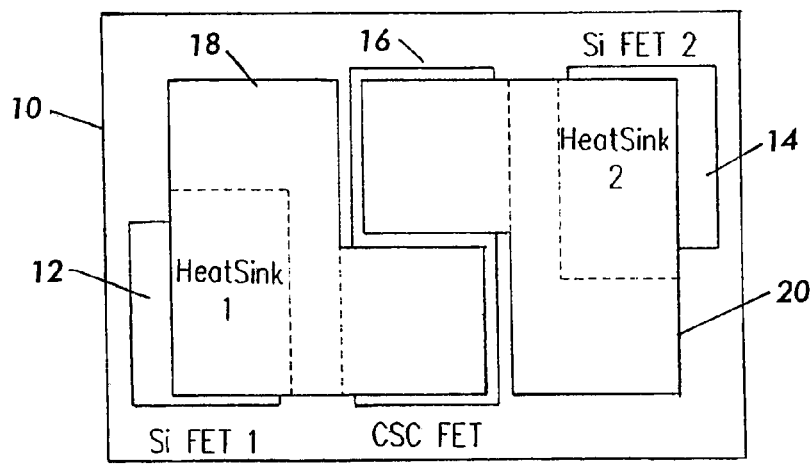
FIG. 12 shows a top plan view of a third embodiment of the present invention.

Referring to FIG. 12, according to the second embodiment, heatsink connecters 18, 20 can have L-shaped top configuration to provide an expanded heat-dissipation area, while covering substantially the entire back of bidirectional CSC 16.

Figure 13:
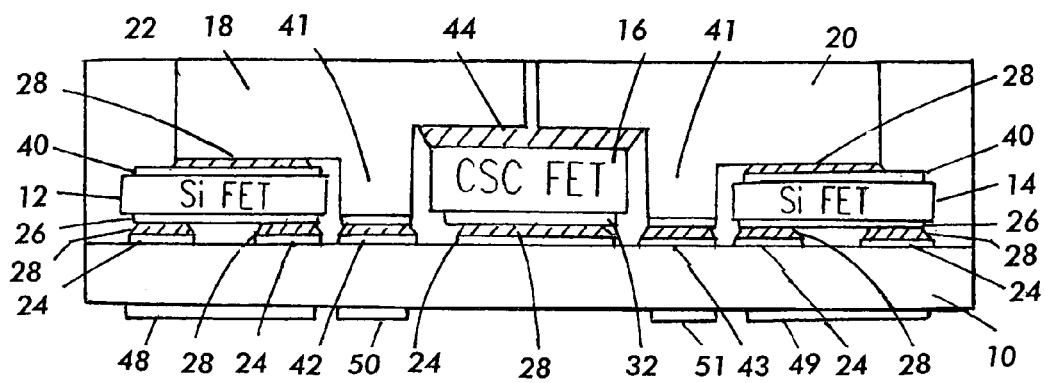
FIG. 13 shows a cross-sectional view of a fourth embodiment of the present invention.

Referring to FIG. 13, according to the fourth embodiment of the present invention a portion of molded housing 22 can be removed to expose at least a portion of the back surface, and preferably all the back surface, of the first and second heatsink connectors 18, 20.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package, comprising:
    a substrate having a plurality of conductive pads disposed on at least one major surface thereof;
    a bidirectional compound semiconductor component having at least a first power electrode electrically and mechanically connected to a respective conductive pad and a second power electrode electrically and mechanically connected to a respective conductive pad;
    a first power semiconductor device having a first power electrode electrically connected to said first power electrode of said compound semiconductor component, and a second power electrode electrically and mechanically connected to at least one conductive pad;
    second power semiconductor having a first power electrode electrically connected to said second power electrode of said compound semiconductor component, and a second power electrode electrically and mechanically connected to at least one conductive pad;
    wherein said bidirectional compound semiconductor component, said first power semiconductor device, and said second power semiconductor device are electrically connected within said package in a cascoded arrangement.

2. The package of claim 1, wherein said first and said second power semiconductor devices are power MOSFETs and said bidirectional compound power semiconductor device is a III-nitride based bidirectional power semiconductor device.

3. The package of claim 1, further comprising a first heatsink electrically connecting said first power electrode of said first power semiconductor device to said first power electrode of said compound semiconductor component, and a second heatsink electrically connecting said first power electrode of said second power semiconductor device to said second power electrode of said compound semiconductor component.

4. The package of claim 3, wherein said first heatsink and said second heatsink are thermally coupled to said compound semiconductor component.

5. The package of claim 4, further comprising a mold housing disposed around said first and second semiconductor devices and said compound semiconductor component.

6. The package of claim 5, wherein said heatsinks are exposed through said mold housing.

7. The package of claim 5, wherein said heatsinks are encapsulated in said mold housing.

8. A semiconductor package comprising:
    a multichip circuit that includes a bidirectional compound semiconductor component, a first power semiconductor device and a second power semiconductor device wire-free-connected in a cascoded configuration; and
    at least one heatsink thermally coupled to said compound semiconductor component and electrically connecting at least one of said power semiconductor devices to said compound semiconductor component.

9. The package of claim 8, further comprising a mold housing.

10. The package of claim 9, wherein said mold housing encapsulates said heatsink.

11. The package of claim 9, wherein said heatsink is exposed through said mold housing.

* * * * *